United States Patent
Seo et al.

(10) Patent No.: US 8,487,338 B2
(45) Date of Patent: Jul. 16, 2013

(54) LIGHT-EMITTING DEVICE, LIGHTING DEVICE, AND MANUFACTURING METHOD OF LIGHT-EMITTING DEVICE

(75) Inventors: Satoshi Seo, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 72 days.

(21) Appl. No.: 13/189,757

(22) Filed: Jul. 25, 2011

(65) Prior Publication Data

US 2012/0018769 A1    Jan. 26, 2012

(30) Foreign Application Priority Data

Jul. 26, 2010    (JP) ................................. 2010-167369

(51) Int. Cl.
*H01L 33/62*    (2010.01)

(52) U.S. Cl.
USPC ........................ 257/99; 257/E33.062; 438/46

(58) Field of Classification Search
USPC    257/99, 43, 57, 89, 79, 292, 83, 655; 438/29, 438/35, 34, 151, 46, 149, 458; 349/71, 141, 349/39, 145; 313/504, 499, 500, 498, 506, 313/491, 492
See application file for complete search history.

(56) References Cited

U.S. PATENT DOCUMENTS

| | | |
|---|---|---|
| 6,825,496 B2 | 11/2004 | Yamazaki et al. |
| 7,161,184 B2 | 1/2007 | Miyagi et al. |
| 7,221,095 B2 | 5/2007 | Yamazaki et al. |
| 7,242,024 B2 | 7/2007 | Yamazaki et al. |
| 7,528,418 B2 | 5/2009 | Yamazaki et al. |
| 7,733,441 B2 | 6/2010 | Seo et al. |
| 7,808,002 B2 | 10/2010 | Yamazaki et al. |
| 2010/0006882 A1 | 1/2010 | Arai |

FOREIGN PATENT DOCUMENTS

| | | |
|---|---|---|
| JP | 11-97183 | 4/1999 |
| JP | 2001-15268 | 1/2001 |
| JP | 2009-140817 | 6/2009 |

*Primary Examiner* — Jarrett Stark
*Assistant Examiner* — Lawrence Tynes, Jr.
(74) *Attorney, Agent, or Firm* — Husch Blackwell LLP

(57) ABSTRACT

It is an object to provide a light-emitting device which has high power efficiency and high light-extraction efficiency and emits light uniformly in a plane. It is another object to provide a manufacturing method of the light-emitting device. It is another object to provide a lighting device including the light-emitting device. One embodiment of the present invention provides a light-emitting device which includes: a first electrode provided over a substrate; a layer containing a light-emitting organic compound provided over the first electrode; an island-shaped insulating layer provided over the layer containing the light-emitting organic compound; an island-shaped auxiliary electrode layer provided over the island-shaped insulating layer; and a second electrode having a property of transmitting visible light provided over the layer containing the light-emitting organic compound and the island-shaped auxiliary electrode layer.

21 Claims, 4 Drawing Sheets

LIGHT-EMITTING DEVICE, LIGHTING DEVICE, AND MANUFACTURING METHOD OF LIGHT-EMITTING DEVICE

BACKGROUND OF THE INVENTION

1. Field of the Invention

The present invention relates to a light-emitting device which emits light by electroluminescence, a manufacturing method of the light-emitting device, and a lighting device.

2. Description of the Related Art

In recent years, research and development have been extensively conducted on light-emitting elements utilizing electroluminescence (EL). A basic structure of a light-emitting element is a simple structure in which a light-emitting layer containing a light-emitting substance is provided between a pair of electrodes and has the following characteristics: its thickness and weight can be reduced; it can respond to input signals fast; it can be driven at low DC voltage; and the like.

A light-emitting element utilizing EL (hereinafter, referred to as an EL element) is expected to be applied mainly to a display and a lighting device. Furthermore, since such EL elements can be formed in a film form, they make it possible to provide planar light emission. An element having a large area can thus be formed. When application of a lighting device is considered, this is a feature which is difficult to obtain with point light sources typified by an incandescent lamp and an LED or line light sources typified by a fluorescent light. For example, it is considered that a lighting device with a nonconventional shape, such as a sheet-like lighting device, can be manufactured. In addition, the light-emitting element has a surface light source; thus, light which is closer to natural light can be easily obtained.

EL elements can be broadly classified according to whether a light-emitting substance is an organic compound or an inorganic compound. In the case of an organic EL element in which a layer containing an organic compound (also referred to as an EL layer) used as a light-emitting substance is provided between a pair of electrodes, application of a voltage to the light-emitting element causes injection of electrons from a cathode and holes from an anode into the layer containing the organic compound having a light-emitting property and thus a current flows. The injected electrons and holes then lead the organic compound having a light-emitting property to its excited state, whereby light emission is obtained from the excited organic compound having a light-emitting property.

Note that as types of an excited state of an organic compound, a singlet excited state and a triplet excited state are known. It is thought that light emission can be obtained through either of the excited states.

As a method for increasing the power efficiency of such an EL element, reducing drive voltage of an EL element is considered for the reason below. In the case where the same amount of current is applied to EL light-emitting elements, the EL light-emitting element to which the current is applied at lower voltage consumes less power than the other EL light-emitting element to which current is applied at higher voltage. However, in general, the luminance of an EL element which can be driven at low voltage is significantly changed due to a small change in drive voltage.

In order to obtain sufficient luminous flux from an EL element so that the EL element is used for lighting, a method of increasing the emission area of the EL element is convenient. However, increasing the emission area causes concern of variation in luminance of a light-emitting surface caused by a voltage drop of a transparent electrode. In particular, an EL light-emitting element which can be driven at low voltage is strongly affected by the voltage drop, and therefore needs countermeasures against the voltage drop.

As the countermeasure, a structure in which a low resistant auxiliary wiring is formed over a transparent electrode has been reported (see Patent Document 1). This method, in which the low resistant auxiliary wiring is formed over the transparent electrode and an inorganic insulating layer is formed over only the auxiliary wiring, allows uniform light emission over the surface of the light-emitting element and a reduction in reactive power over the auxiliary wiring.

REFERENCE

[Patent Document]
[Patent Document 1] Japanese Published Patent Application No. H 11-97183

SUMMARY OF THE INVENTION

In a light-emitting device disclosed in Patent Document 1, light emitted from an EL layer is emitted to the external air through a transparent electrode and a transparent substrate. The refractive index of ITO (indium tin oxide) which is used as the transparent electrode of the light-emitting device in Patent Document 1 is approximately 2.0, the refractive index of a glass substrate which is used as the transparent substrate is approximately 1.6 in general, and the refractive index of the air is 1. Thus, there is a problem in that total reflection occurs at the boundary between the transparent electrode and the transparent substrate and the boundary between the transparent substrate and the air, the amount of light which is not emitted to the external air is large, and the light-extraction efficiency is small.

In Patent Document 1, a structure in which a dome-shaped projection portion is formed over the transparent substrate in order to increase the light-extraction efficiency has been reported. This structure can suppress total reflection at the boundary between the transparent substrate and the air. However, even with the use of such a structure, the light which is totally reflected at the boundary between the transparent electrode and the transparent substrate cannot be extracted; thus, the light-extraction efficiency of the light-emitting device is not sufficient. Therefore, further improvement in the light-extraction efficiency has been demanded.

It is an object to provide a light-emitting device which has high power efficiency and high light-extraction efficiency and emits light uniformly in a plane. It is another object to provide a manufacturing method of the light-emitting device. It is another object to provide a lighting device including the light-emitting device.

In order to achieve any of the above objects, one embodiment of the present invention focuses on a structure in which light emission is extracted from a side opposite to an element substrate over which a transistor and the like are formed (top emission structure).

In other words, one embodiment of the present invention is a light-emitting device which includes: a first electrode provided over a substrate; a layer containing a light-emitting organic compound provided over the first electrode; an island-shaped insulating layer provided over the layer containing the light-emitting organic compound; an island-shaped auxiliary electrode layer provided over the insulating layer; and a second electrode having a property of transmitting visible light (hereinafter, also simply referred to as a light-transmitting property) provided over the layer containing the light-emitting organic compound and the auxiliary electrode layer.

In one embodiment of the present invention, since the light-emitting device includes the island-shaped insulating layer and the island-shaped auxiliary electrode layer overlapped with the insulating layer over the layer containing the light-emitting organic compound (EL layer), a voltage drop can be suppressed and variation in luminance in a plane can be reduced. Further, since the insulating layer is provided between the auxiliary electrode layer and the EL layer, voltage does not flow to a portion of the EL layer which is blocked by the auxiliary electrode layer. Therefore, supplied power can efficiently contribute to light emission of a portion where the auxiliary electrode layer and the insulating layer are not formed, whereby a reduction in power efficiency can be suppressed.

Further, since a top emission structure is employed in one embodiment of the present invention, light is not necessarily extracted through a substrate where an element is formed. As a result, there is no possibility that emitted light is absorbed by the element substrate; therefore, an inexpensive element substrate to which no special care for a light-transmitting property is given can be used. In addition, as the element substrate, a non-breakable or flexible substrate such as a plastic substrate can be used, which leads to expansion of the range of practical use.

Further, the refractive index of ITO which is a typical example of a light-transmitting electrode is approximately 2.0 and the refractive index of a glass substrate which is a typical example of an element substrate is approximately 1.6 in general, each of which is larger than the refractive index of the air of 1. Therefore, when light is extracted from the substrate side in which the electrode is formed, total reflection occurs at the boundary between the electrode and the substrate and the boundary between the substrate and the air; thus, the efficiency of extraction of light to the external air, i.e., the light-extraction efficiency, is low.

On the other hand, in the top emission structure, total reflection occurs only at the boundary between the light-transmitting electrode and the air. Therefore, a light-emitting device having the top emission structure which is one embodiment of the present invention can have higher light-extraction efficiency than a light-emitting device having a bottom emission structure.

Further, the light-emitting device having the top emission structure which is one embodiment of the present invention can be easily devised in a variety of ways to improve the light-extraction efficiency, as compared to a light-emitting device having a bottom emission structure.

In the above light-emitting device of one embodiment of the present invention, the light-transmitting second electrode may have unevenness. Alternatively, an uneven layer having a property of transmitting visible light may be provided over the second electrode. By forming unevenness over the second electrode, the light-extraction efficiency can be increased.

In the above light-emitting device, the layer containing the light-emitting organic compound preferably contains a composite material layer containing an organic compound and a metal oxide. When the composite material layer is formed, the carrier injection property from the electrode to the light-emitting substance becomes preferable and the drive voltage of the light-emitting element can be reduced.

In particular, when the composite material layer is formed in contact with the first electrode, a variety of metals, alloys, and electrically conductive compounds, a mixture thereof, or the like can be used as the first electrode regardless of the work function. Therefore, the selection range of a material having a high reflectance which can be used for the first electrode is increased, which is preferable.

In addition, the composite material layer is preferably formed in contact with the second electrode, in which case damage to the EL layer at the formation can be reduced.

Alternatively, in any of the above light-emitting devices of one embodiment of the present invention, unevenness may be formed between the substrate and the first electrode. When an uneven layer is formed between the element substrate and the reflective electrode, the light-extraction efficiency can be increased.

Further, one embodiment of the present invention may include a lighting device including the light-emitting device.

Another embodiment of the present invention is a manufacturing method of a light-emitting device comprising the steps of: forming a first electrode over a substrate; forming a layer containing a light-emitting organic compound over the first electrode; providing a shadow mask over the layer containing the light-emitting organic compound; forming an island-shaped insulating layer over the layer containing the light-emitting organic compound; forming an island-shaped auxiliary electrode layer over the insulating layer; removing the shadow mask; and forming a second electrode having a property of transmitting visible light over the layer containing the light-emitting organic compound and the auxiliary electrode layer.

In the above manufacturing method, the insulating layer and the auxiliary electrode layer are patterned using the same mask without another alignment; therefore, a light-emitting device can be manufactured simply and easily. Further, since facilities for high-accuracy alignment are unnecessary, a light-emitting device can be manufactured using inexpensive manufacturing facilities.

In any of the above methods, after the second electrode is formed, unevenness may be formed in the second electrode. Alternatively, after the second electrode is formed, an uneven layer having a property of transmitting visible light may be formed.

In any of the above manufacturing methods, it is preferable to form a composite material layer containing an organic compound and a metal oxide, which is in contact with the first electrode, as one layer in the layer containing a light-transmitting organic compound. In addition, a composite material layer containing an organic compound and a metal oxide, which is in contact with the second electrode, is preferably formed.

According to one embodiment of the present invention, a light-emitting device which has high power efficiency and high light-extraction efficiency and emits light uniformly in a plane can be provided. Further, a manufacturing method of the light-emitting device can be provided. Furthermore, a lighting device including the light-emitting device can be provided.

DETAILED DESCRIPTION OF THE INVENTION

Figure 1A:
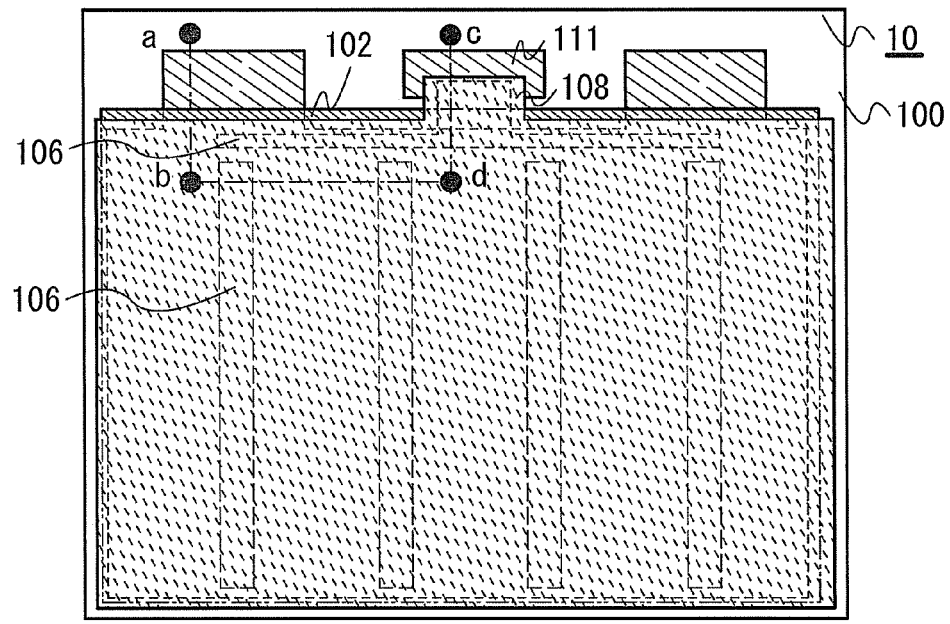
FIGS. 1A and 1B illustrate a light-emitting device of one embodiment of the present invention.

Embodiments will be described in detail with reference to the drawings. It is easily understood by those skilled in the art that modes and details thereof can be modified in various ways without departing from the spirit and scope of the present invention. Therefore, the present invention should not be interpreted as being limited to what is described in the embodiments below. In the structures of the present invention described below, the same portions or portions having similar functions are denoted by the same reference numerals in different drawings, and explanation thereof will not be repeated.

(Embodiment 1)

Figure 1B:
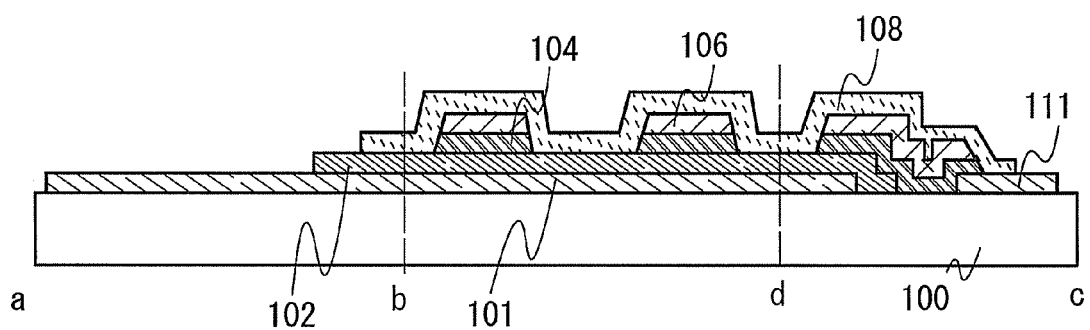

In this embodiment, a light-emitting device of one embodiment of the present invention is described with reference to FIGS. 1A and 1B. FIG. 1B is a cross-sectional view taken along lines a-b, b-d, and c-d in a light-emitting device 10 illustrated in FIG. 1A.

The light-emitting device 10 illustrated in FIG. 1B includes a first electrode 101 over a substrate 100 and an EL layer 102 including a light-emitting layer over the first electrode 101. Further, an island-shaped insulating layer 104, an island-shaped auxiliary electrode layer 106 overlapped with the insulating layer 104, and a second electrode 108 having a property of transmitting visible light, which is in contact with the EL layer 102 and the auxiliary electrode layer 106, are provided over the EL layer 102. In addition, the light-emitting device 10 includes a conductive layer 111 formed using a material similar to that of the first electrode 101. The conductive layer 111 functions as a connection terminal.

Since the light-emitting device 10 includes the auxiliary electrode layer 106 which is in contact with the second electrode 108, a voltage drop can be suppressed and variation in luminance in a plane can be reduced. Further, since the insulating layer 104 is provided between the auxiliary electrode layer 106 and the EL layer 102, current does not flow to a portion of the EL layer 102, in which light is blocked by the auxiliary electrode layer 106. Therefore, supplied power can efficiently contribute to light emission of a portion where the auxiliary electrode layer 106 and the insulating layer 104 are not formed, whereby a reduction in power efficiency can be suppressed.

In general, in a light-emitting device having a bottom emission structure, total reflection occurs at the boundary between a light-transmitting electrode and a light-transmitting element substrate and the boundary between the element substrate and the air. However, in the light-emitting device 10 having a top emission structure, total reflection occurs only at the boundary between the light-transmitting electrode and the air. Therefore, the light-emitting device 10 has higher light-extraction efficiency than a light-emitting device having a bottom emission structure.

Moreover, since there are fewer portions where total reflection occurs as compared to a light-emitting device having a bottom emission structure, the light-emitting device 10 having a top emission structure can be easily devised in a variety of ways to improve the light-extraction efficiency. For example, the second electrode 108 may be uneven or an uneven layer may be stacked over the second electrode 108.

The EL layer 102 includes a light-emitting layer containing a light-emitting substance. The EL layer 102 can have a stacked-layer structure where a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

A manufacturing method of the light-emitting device 10 illustrated in FIGS. 1A and 1B will be described with reference to FIGS. 3A to 3D.

First, the first electrode 101 and the conductive layer 111 formed using a material similar to that of the first electrode 101 are formed over the substrate 100.

As the material of the substrate 100, a material which functions as a support of a light-emitting element, for example, glass, plastic, metal, or the like can be used.

In a bottom emission structure where light emitted from a light-emitting element is extracted to the outside through an element substrate provided with a transistor and the like, the element substrate needs to have a property of transmitting visible light. On the other hand, a top emission structure is employed in one embodiment of the present invention. Since light is not necessarily extracted through the substrate 100, there is no limitation on the material of the substrate 100 and an inexpensive substrate can be used. For example, a flexible substrate such as a plastic substrate can be used as the substrate 100.

Before the first electrode 101 which is a reflective electrode is formed, unevenness (or an uneven layer) may be formed over the substrate 100. By forming the unevenness, the function of the reflective electrode can be enhanced and the light-extraction efficiency can be improved. There is no limitation on a material, a refractive index, a property of transmitting visible light, and the like of the unevenness. Heat treatment may be performed, and there is also no limitation on a method for forming the unevenness. For example, a nanoimprint method or a photolithography process can be used.

The first electrode 101 is a layer that functions as an anode and as a reflective electrode. For example, by using an alloy containing aluminum (aluminum alloy), an electrode having excellent reflectance can be obtained. Examples of the aluminum alloy include an alloy of aluminum and titanium, an alloy of aluminum and neodymium, an alloy of aluminum and nickel, and the like. Alternatively, a stacked film of an aluminum alloy film and a film containing a metal or a metal oxide may be used. Stacking the film containing a metal or a metal oxide over the aluminum alloy film can suppress oxidation of the aluminum alloy to facilitate hole injection from the first electrode 101 to the EL layer 102. As examples of a material for the film containing a metal or a metal oxide, titanium, titanium oxide, and the like can be given. Further, the above materials are preferable, because they are present in large amounts in the Earth's crust and inexpensive to achieve a reduction in the cost of manufacturing a light-emitting element. In particular, aluminum and titanium are further preferable since they are abundant materials in the Earth's crust. The first electrode 101 may have unevenness to increase reflectance.

In particular, when a layer containing a composite material described later in which an acceptor substance is mixed with an organic compound having a high hole-transport property (composite material layer) is provided in contact with the first electrode 101, any of a variety of metals, alloys, and electrically conductive compounds, a mixture thereof, or the like can be used regardless of the work function. Therefore, the selection range of a material having a high reflectance which can be used for the first electrode 101 is increased, which is preferable.

Figure 2A:
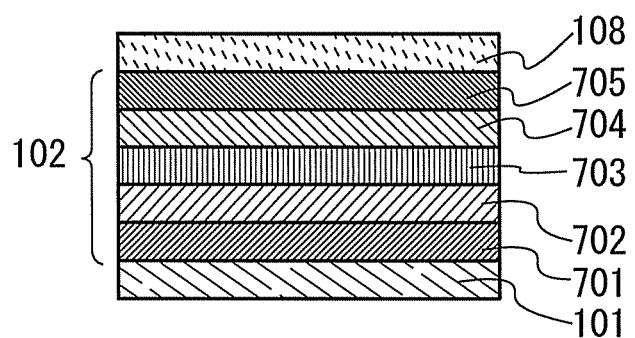
FIGS. 2A to 2C each show an example of a structure of an EL layer.
Figure 3A:
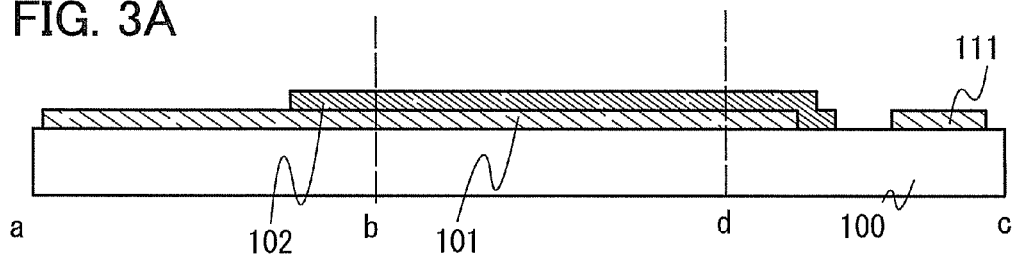
FIGS. 3A to 3D illustrate a manufacturing method of a light-emitting device of one embodiment of the present invention.

Next, the EL layer 102 is formed over the first electrode 101 (FIG. 3A). In this embodiment, the EL layer 102 includes, from the anode (first electrode 101) side, a hole-injection layer 701, a hole-transport layer 702, a light-emitting layer 703, an electron-transport layer 704, and an electron-injection layer 705 (FIG. 2A).

The hole-injection layer 701 is a layer containing a substance having a high hole-injection property. Examples of applicable substances having a high hole-injection property are metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of applicable substances are phthalocyanine-based compounds such as phthalocyanine (abbreviation: $H_2Pc$) and copper(II) phthalocyanine (abbreviation: CuPc).

Other examples of applicable substances are aromatic amine compounds which are low molecular organic compounds such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples of applicable substances are high molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), and polyaniline/poly(styrenesulfonic acid) (PAni/PSS).

In particular, for the hole-injection layer 701, a composite material in which an acceptor substance is mixed with an organic compound having a high hole-transport property is preferably used. With the use of the composite material in which an acceptor substance is added to a substance having a high hole-transport property, hole injection from the first electrode 101 is facilitated, which leads to a reduction in the drive voltage of the light-emitting element. Such a composite material can be formed by co-depositing a substance having a high hole-transport property and an acceptor substance. The hole-injection layer 701 is formed using the composite material, whereby hole injection from the first electrode 101 to the EL layer 102 is facilitated.

As the organic compound used for the composite material, any of a variety of compounds such as aromatic amine compounds, carbazole derivatives, aromatic hydrocarbons, and high molecular compounds (e.g., oligomers, dendrimers, and polymers). Note that the organic compound used for the composite material is preferably an organic compound having a high hole-transport property. Specifically, a substance having a hole mobility of $10^{-6}$ $cm^2/Vs$ or more is preferably used. Note that other than these substances, any substance that has a property of transporting more holes than electrons may be used. The organic compounds which can be used for the composite material will be specifically described below.

Examples of the organic compound that can be used for the composite material are aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Other examples of the organic compound that can be used are aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds such as 7,7,8,8-tetracyano-2,3,5,6-tetrafluoro-quinodimethane (abbreviation: $F_4$-TCNQ) and chloranil, transition metal oxides, and oxides of metals that belong to Groups 4 to 8 in the periodic table. Specific preferred examples include vanadium oxide, niobium oxide, tantalum oxide, chromium oxide, molybdenum oxide, tungsten oxide, manganese oxide, and rhenium oxide because their electron-acceptor properties are high. Among these, molybdenum oxide is especially preferable since it is stable in the air and its hygroscopic property is low and is easily treated.

The composite material may be formed using the above-described electron acceptor and the above-described high molecular compound such as PVK, PVTPA, PTPDMA, or Poly-TPD and used for the hole-injection layer 701.

The hole-transport layer 702 is a layer that contains a substance having a high hole-transport property. Examples of the substance having a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ $cm^2/Vs$ or more. Note that other than the above substances, any substance that has a property of transporting more holes than electrons may be used. Further, the layer containing a substance having a high hole-transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

The light-emitting layer 703 is a layer containing a light-emitting substance. As the light-emitting substance, for example, a fluorescent compound, which emits fluorescence, or a phosphorescent compound, which emits phosphorescence, can be used.

The fluorescent compounds that can be used for the light-emitting layer 703 will be given. Examples of the materials that emit blue light include N,N'-bis[4-(9H-carbazol-9-yl)phenyl]-N,N'-diphenylstilbene-4,4'-diamine (abbreviation: YGA2S),4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of the materials that emit red light include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the light-emitting layer 703 will be given. Examples of the materials that emit blue light include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(III)picolinate (abbreviation: Ir(CF$_3$ppy)$_2$(pic)), bis[2-(4',6'-difluorophenyl)pyridinato-N,$C^{2'}$]iridium (III)acetylacetonate (abbreviation: FIr(acac)), and the like. Examples of the materials that emit green light include tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dm-moppr)$_2$(acac)), and the like. Examples of the materials that emit orange light include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium (III) (abbreviation: Ir(mppr-iPr)$_2$(acac)), and the like. Examples of the materials that emit red light include organometallic complexes such as bis[2-(2'-benzo[4,5-α]thienyl)pyridinato-N,$C^{3'}$)iridium(III) acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac), (acetylacetonato)bis[2,3-bis(4-fluorophenyl)quinoxalinato]iridium (III) (abbreviation: Ir(Fdpq)$_2$(acac)), acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphine)platinum(II) (abbreviation: PtOEP). Any of the following rare earth metal complexes can be used as a phosphorescent compound: tris(acetylacetonato) (monophenanthroline)terbium(III) (abbreviation: Tb(acac)$_3$(Phen)); tris(1,3-diphenyl-1,3-propanedionato) (monophenanthroline)europium(III) (abbreviation: Eu(DBM)$_3$(Phen)); and tris[1-(2-thenoyl)-3,3,3-trifluoroacetonato](monophenanthroline)europium(III) (abbreviation: Eu(TTA)$_3$(Phen)), because their light emission (generated by electronic transition between different multiplicities) from a rare earth metal ion in such a rare earth metal complex.

Note that the light-emitting layer 703 may have a structure in which the above-described light-emitting material (a guest material) is dispersed in another substance (a host material). As the host material, various kinds of materials can be used, and it is preferable to use a substance which has a lowest unoccupied molecular orbital level (LUMO level) higher than the light-emitting material and has a highest occupied molecular orbital level (HOMO level) lower than that of the light-emitting material.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinonato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)

diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Further, examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N-diphenylamino)-1,4-phenylene]} (abbreviation: CN-PPV-DPD), and the like.

Further, by providing a plurality of light-emitting layers and making emission colors of the light-emitting layers different, light emission having a desired color can be obtained from the light-emitting element as a whole. For example, the emission colors of first and second light-emitting layers are complementary in a light-emitting element having the two light-emitting layers, whereby the light-emitting element can be made to emit white light as a whole. Note that the term "complementary" means color relationship in which an achromatic color is obtained when colors are mixed. That is, emission of white light can be obtained by mixture of light emitted from substances whose emission colors are complementary colors. This can be applied to a light-emitting element having three or more light-emitting layers.

The electron-transport layer 704 is a layer containing a substance having a high electron-transport property. As the substance having a high electron-transport property, the following metal complexes having a quinoline skeleton or a benzoquinoline skeleton can be given: tris(8-quinolinolato) aluminum (abbreviation: Alq); tris(4-methyl-8-quinolinolato)aluminum (abbreviation: Almq$_3$); bis(10-hydroxybenzo[h]-quinolinato)beryllium (abbreviation: BeBq$_2$); and bis(2-methyl-8-quinolinolato)(4-phenylphenolato)aluminum (abbreviation: BAlq). A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can also be used. Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances described here are mainly materials having an electron mobility of $10^{-6}$ cm$^2$/Vs or more. Further, the electron-transport layer is not limited to a single layer, and may be a stack of two or more layers containing any of the above substances are stacked.

The electron-injection layer 705 is a layer that contains a substance having a high electron-injection property. Examples of the substance that can be used for the electron-injection layer 705 are alkali metals, alkaline earth-metals, and compounds thereof, such as lithium, cesium, calcium, lithium fluoride, cesium fluoride, calcium fluoride, and lithium oxide, rare earth-metal compounds such as erbium fluoride, and the above-mentioned substances for forming the electron-transport layer 704.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an ink-jet method, or a coating method.

Figure 2B:
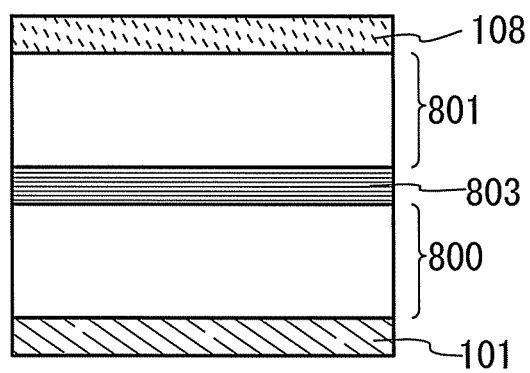

Note that a plurality of EL layers may be stacked between the first electrode 101 and the second electrode 108 as illustrated in FIG. 2B. In that case, a charge generation layer 803 is preferably provided between a first EL layer 800 and a second EL layer 801 which are stacked. The charge generation layer 803 can be formed using the above-mentioned composite material. Further, the charge generation layer 803 may have a stacked structure including a layer containing the composite material and a layer containing another material. In that case, as the layer containing another material, a layer containing an electron donating substance and a substance with a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with any of the above-mentioned structures of the EL layer.

Further, by making emission colors of the EL layers different, light having a desired color can be obtained from the light-emitting element as a whole. For example, the emission colors of the first and second EL layers are complementary in a light-emitting element having the two EL layers, whereby the light-emitting element can be made to emit white light as a whole. This can be applied to a light-emitting element having three or more EL layers.

Figure 2C:
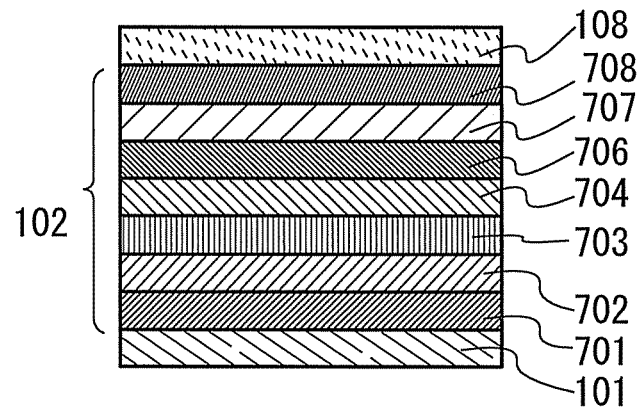

As illustrated in FIG. 2C, the EL layer 102 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 101 and the second electrode 108.

It is preferable to provide the composite material layer 708 which is in contact with the second electrode 108, in which case damage caused to the EL layer 102 particularly when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, and carbonate), or a rare earth metal compound (e.g., an oxide, a halide, and carbonate). Note that as the substance having a high electron-injection property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor material contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, for example, any of CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. A metal-oxygen double bond has an acceptor property (a property of easily accepting electrons); thus, electrons can be transferred (donated and accepted) more easily. Further, a metal complex having a metal-oxygen double bond is considered stable. Thus, the use of a metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl) pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl-1,4,5,8-naphthalenetetracarb oxylic diimide (abbreviation: NTCDI-C8F), 3',4'-dibutyl-5,5''-bis(dicyanomethylene)-5,5''-dihydro-2,2':5',2''-terthiophen) (abbreviation: DCMT), methanofullerene such as [6,6]-phenyl C$_{61}$ butyric acid methyl ester, or the like can be used for the electron-relay layer 707.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may be each formed using any of the above-described materials.

Figure 3B:
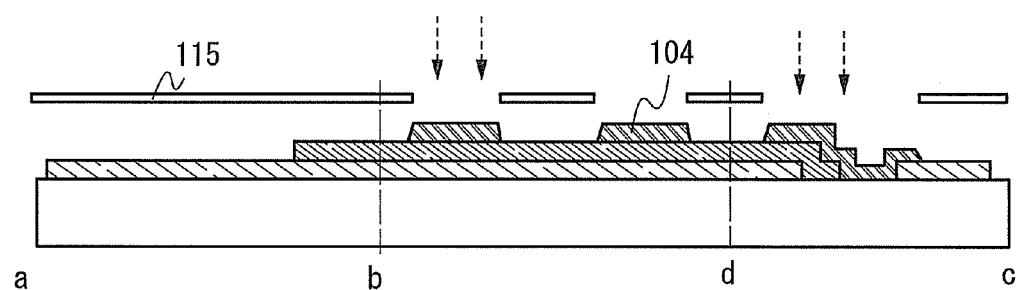
Figure 3C:
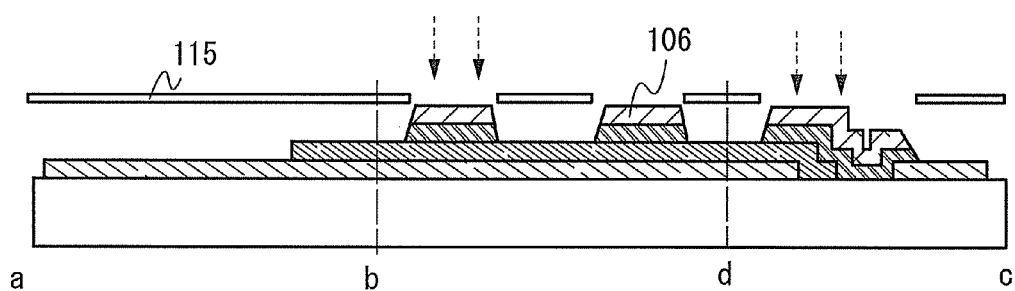

Next, a shadow mask 115 is provided over the EL layer 102, and the island-shaped insulating layer 104 and the island-shaped auxiliary electrode layer 106 overlapped with the insulating layer 104 are successively formed (FIGS. 3B and 3C). As illustrated in FIGS. 3B and 3C, the insulating layer 104 and the auxiliary electrode layer 106 have a forward tapered shape (a cross-sectional shape is a trapezoid whose upper base is shorter than the lower base). In addition, in the insulating layer 104, the area of a surface which is in contact with the EL layer 102 is larger than the area of a surface which is in contact with the auxiliary electrode layer 106.

There is no particular limitation on the insulating layer 104 as long as it is a film having an insulating property which can be formed using a shadow mask. For example, lithium fluoride, calcium fluoride, magnesium fluoride, or the like may be formed by an evaporation method. In other words, the electron-injection layer 705 and the insulating layer 104 can be formed using the same material. Alternatively, aluminum oxide or the like may be formed by a sputtering method. Further alternatively, an organic compound having a high hole-transport property which can be used for the hole-transport layer 702 or an organic compound having a low electron-transport property may be used.

There is no particular limitation on the auxiliary electrode layer 106 as long as it is a conductive film which can be formed using a shadow mask. A layer having a higher conductivity than a second electrode described later is preferably used. In particular, the sheet resistance of the auxiliary electrode layer 106 is preferably lower than the sheet resistance of the second electrode by 2 to 3 orders of magnitude.

As the material of the auxiliary electrode layer 106, aluminum, copper, silver or the like can be used. As the auxiliary electrode layer 106, an aluminum alloy film or a stacked film of a plurality of metal films can be used. Alternatively, the auxiliary electrode layer 106 may contain titanium, tungsten, tantalum, molybdenum, or the like.

Figure 3D:
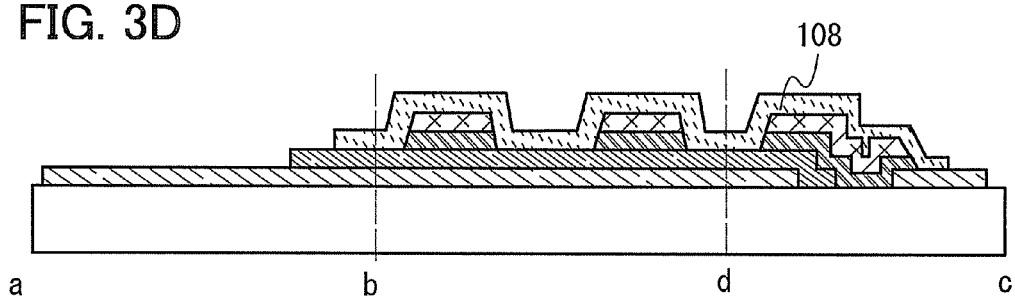

Next, the shadow mask 115 is removed over the EL layer 102. After that, the second electrode 108 having a property of transmitting visible light, which covers the insulating layer 104 and the auxiliary electrode layer 106, is formed over the EL layer 102 (FIG. 3D).

The second electrode 108 functions as a cathode and as an electrode having a property of transmitting visible light. In order to extract light generated in the light-emitting layer to the outside, the second electrode 108 preferably has a transmissivity of 30% or more with respect to light in the visible light region (wavelength range from 400 nm to 800 nm). Further, when a micro-cavity (micro resonator) structure is applied, the second electrode 108 preferably has a transmissivity of 30% to 80% and a reflectance of 30% to 60%.

As the second electrode 108, any of a variety of metals, alloys, and electrically conductive compounds, and a mixture thereof can be used. Specifically, it is possible to use a film of a conductive metal oxide having a property of transmitting visible light, such as indium oxide-tin oxide (ITO: indium tin oxide), indium oxide-tin oxide which contains silicon or silicon oxide, indium oxide-zinc oxide (IZO: indium zinc oxide), or indium oxide containing tungsten oxide and zinc oxide (IWZO). Preferably, this conductive metal oxide film has excellent transmissivity of visible light and a thickness of about 70 nm to 100 nm in consideration of the conductivity. Such a conductive metal oxide film is generally formed by sputtering; however, the film may be formed by an ink-jet method, a spin containing method, or the like by application of a sol-gel method or the like. For example, an IZO film can be formed by a sputtering method using indium oxide, to which zinc oxide is added at 1 wt % to 20 wt %, as a target. An IWZO film can be formed by a sputtering method using a target in which tungsten oxide and zinc oxide are mixed at 0.5 wt % to 5 wt % and 0.1 wt % to 1 wt %, respectively, with indium oxide. In addition, gold, platinum, nickel, tungsten, chromium, molybdenum, iron, cobalt, copper, palladium, titanium, a nitride of a metal (such as titanium nitride), and the like are given. By forming a thin film using such the metal film, the film can be an electrode having a sufficient property of transmitting visible light. In consideration of transmissivity and reflectance, the thickness of the film is preferably 5 nm to 20 nm.

In addition, the second electrode 108 is preferably formed using a metal or an alloy which has a low work function (specifically, 3.8 eV or lower), or the like. For example, aluminum, silver, an aluminum alloy, or the like can be used. Moreover, any of the following materials can be used: elements that belong to Group 1 or Group 2 in the periodic table, that is, alkali metals such as lithium and cesium or alkaline-earth metals such as magnesium, calcium, or strontium, or alloys thereof (e.g., magnesium-silver alloy (Mg—Ag) and aluminum-lithium alloy (Al—Li)); rare earth metals such as europium or ytterbium, or alloys thereof; or the like. By forming a thin film using such an alkali metal, an alkaline earth metal, or an alloy thereof, this film can be an electrode having a sufficient property of transmitting visible light. In consideration of transmissivity and reflectance, the thickness of the film is preferably 5 nm to 20 nm. In addition, since an alkali metal, an alkaline earth metal, or an alloy thereof has high conductivity, a film formed using such a material sufficiently functions as an electrode as long as it has a thickness of 5 nm to 20 nm. A film of an alkali metal, an alkaline earth metal, or an alloy thereof can be formed by a vacuum evaporation method. Alternatively, a film of an alloy containing an alkali metal or an alkaline earth metal can be formed by a sputtering method. Further, a silver paste or the like can be applied by an ink jet method to form the second electrode 108.

Further, the second electrode 108 is not limited to a single layer but may be a stack of two or more layers. For example, the second electrode 108 may have a structure in which, over the thin film of the above-described alkali metal, alkaline earth metal, or alloy thereof, a film of a conductive metal oxide such as ITO, indium oxide-tin oxide which contains silicon or silicon oxide, IZO, or IWZO is stacked.

However, in the case where a layer in the EL layer, which is in contact with the second electrode 108, is a composite material layer formed by mixing any of the above-described organic compounds and an electron donor, the second electrode 108 can be formed using any of a variety of metals, alloys, and electrically conductive compounds, a mixture thereof, or the like regardless of the work function.

Further, a structure or a material for improving the extraction efficiency may be formed over the second electrode 108. For example, an uneven layer having a property of transmitting visible light may be stacked over the second electrode 108. Alternatively, the second electrode 108 may have unevenness.

For example, after the second electrode 108 is formed, an uneven layer having a property of transmitting visible light may be formed using a target including a fine particle whose refractive index is 1.7 or larger by a sputtering method. As the fine particle whose refractive index is 1.7 or larger, for example, ITO or titanium oxide ($TiO_2$) can be used.

Alternatively, after the second electrode 108 is formed, a high-definition metal mask having an opening with a shape such as a circle, an ellipse, a triangle, a square, a rectangle, a polygon, or the like is provided so as not to be in contact with the substrate so that an uneven layer having a property of transmitting visible light can be formed. As the material for the uneven layer having a property of transmitting visible light, ITO, $TiO_2$, or the like can be used. The uneven layer having a property of transmitting visible light preferably has a refractive index of 1.7 or larger.

In the above manner, the light-emitting device 10 of this embodiment can be manufactured. Since the light-emitting device of this embodiment includes the auxiliary electrode layer which is in contact with the second electrode, a voltage drop can be suppressed and variation in luminance in a plane can be reduced. Further, since the insulating layer is provided between the auxiliary electrode layer and the EL layer, current does not flow to a portion of the EL layer which is blocked by the auxiliary electrode layer. Therefore, supplied power can efficiently contribute to light emission of a portion where the auxiliary electrode layer and the insulating layer are not formed, whereby a reduction in power efficiency can be suppressed.

Moreover, since the light-emitting device of one embodiment of the present invention has a top emission structure, it has higher light-extraction efficiency than a light-emitting device having a bottom emission structure. In addition, since there are fewer portions where total reflection occurs as compared to a light-emitting device having a bottom emission structure, the light-emitting device having a top emission structure of this embodiment can be easily devised in a variety of ways to improve the light-extraction efficiency.

In a manufacturing method of a light-emitting device of this embodiment, an auxiliary electrode layer and an insulating layer are patterned using the same shadow mask; therefore, alignment with high accuracy is unnecessary, and a light-emitting device or a lighting device including the light-emitting device can be manufactured simply and easily without high-cost photolithography.

This embodiment can be combined with any of the other embodiments in this specification as appropriate.

(Embodiment 2)

In this embodiment, a lighting device in which the light-emitting device manufactured according to one embodiment of the present invention is used will be described with reference to FIGS. 4A and 4B.

Figure 4A:
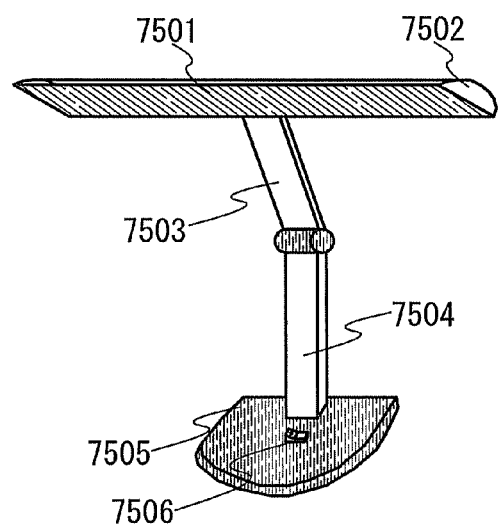
FIGS. 4A and 4B illustrate lighting devices of one embodiment of the present invention.

FIG. 4A illustrates a lighting device (desk lamp), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. Note that the lighting device includes, in its category, ceiling lights (ceiling-fixed lighting devices), wall lights (wall-hanging lighting devices), and the like in addition to the desk lamp illustrated in FIG. 4A.

Note that by using the light-emitting device to which one embodiment of the present invention is applied for the lighting portion 7501 of the lighting device (desk lamp), the lighting device (desk lamp) which has high power efficiency and light-extraction efficiency and emits light uniformly in a plane can be provided.

Figure 4B:
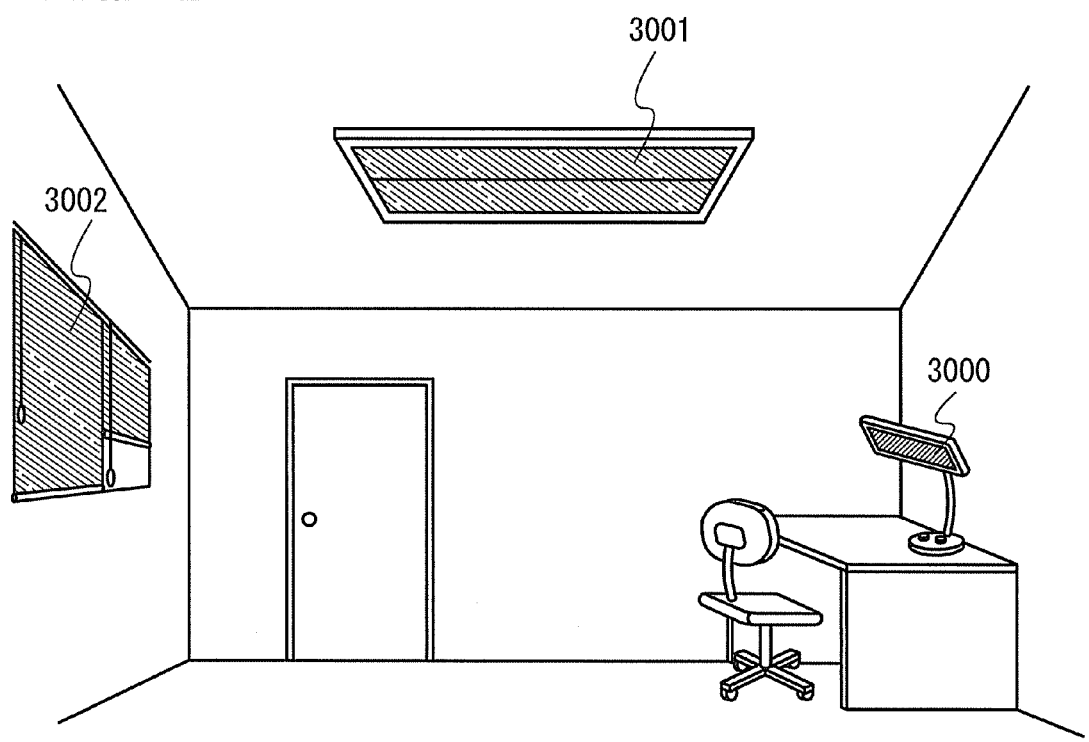

FIG. 4B shows an example in which a light-emitting device to which one embodiment of the present invention is applied is used for an interior lighting device. The light-emitting device of one embodiment of the present invention is advantageous in increasing the area, and thus can be used as a lighting device having a large area as illustrated by a ceiling light 3001. In addition, the light-emitting device can be used for a wall-hanging lighting device 3002. Note that by using the light-emitting device to which one embodiment of the present invention is applied, a lighting device which has high power efficiency and high light-extraction efficiency and emits light uniformly in a plane can be provided. As illustrated in FIG. 4B, a desk lamp 3000 illustrated in FIG. 4A may be used together in a room provided with the interior lighting device.

This application is based on Japanese Patent Application serial no. 2010-167369 filed with Japan Patent Office on Jul. 26, 2010, the entire contents of which are hereby incorporated by reference.

What is claimed is:

1. A light-emitting device comprising:
   a first electrode over a substrate;
   a layer containing a light-emitting organic compound over the first electrode;
   an island-shaped insulating layer over the layer containing the light-emitting organic compound;
   an island-shaped auxiliary electrode layer over the island-shaped insulating layer; and
   a second electrode having a property of transmitting visible light over the island-shaped auxiliary electrode layer.

2. The light-emitting device according to claim 1, wherein the second electrode has unevenness.

3. The light-emitting device according to claim 1, wherein an uneven layer having a property of transmitting visible light is over the second electrode.

4. The light-emitting device according to claim 1, wherein the layer containing the light-emitting organic compound includes a composite material layer containing an organic compound and a metal oxide, the composite material layer being in contact with the first electrode.

5. The light-emitting device according to claim 1, wherein the layer containing the light-emitting organic compound includes a composite material layer containing an organic compound and a metal oxide, the composite material layer being in contact with the second electrode.

6. The light-emitting device according to claim 1, wherein unevenness is provided between the substrate and the first electrode.

7. A lighting device comprising the light-emitting device according to claim 1.

8. A light-emitting device comprising:
    a first electrode over a substrate;
    a layer containing a light-emitting organic compound over the first electrode;
    an island-shaped insulating layer over the layer containing the light-emitting organic compound;
    an island-shaped auxiliary electrode layer over the island-shaped insulating layer;
    a second electrode having a property of transmitting visible light over the island-shaped auxiliary electrode layer; and
    a third electrode over the substrate; the third electrode being electrically connected to the second electrode.

9. The light-emitting device according to claim 8, wherein the second electrode has unevenness.

10. The light-emitting device according to claim 8, wherein an uneven layer having a property of transmitting visible light is over the second electrode.

11. The light-emitting device according to claim 8, wherein the layer containing the light-emitting organic compound includes a composite material layer containing an organic compound and a metal oxide, the composite material layer being in contact with the first electrode.

12. The light-emitting device according to claim 8, wherein the layer containing the light-emitting organic compound includes a composite material layer containing an organic compound and a metal oxide, the composite material layer being in contact with the second electrode.

13. The light-emitting device according to claim 8, wherein unevenness is provided between the substrate and the first electrode.

14. The light-emitting device according to claim 8, wherein the first electrode and the third electrode are formed of the same material.

15. A lighting device comprising the light-emitting device according to claim 8.

16. A manufacturing method of a light-emitting device comprising the steps of:
    forming a first electrode over a substrate;
    forming a layer containing a light-emitting organic compound over the first electrode;
    forming an island-shaped insulating layer over the layer containing the light-emitting organic compound;
    forming an island-shaped auxiliary electrode layer over the island-shaped insulating layer; and
    forming a second electrode having a property of transmitting visible light over the island-shaped auxiliary electrode layer.

17. The manufacturing method of a light-emitting device, according to claim 16, further comprising the steps of:
    providing a shadow mask over the layer containing the light-emitting organic compound before forming the island-shaped insulating layer, the shadow mask being used for forming the island-shaped insulating layer and the island-shaped auxiliary electrode layer; and
    removing the shadow mask after the step of forming the island-shaped auxiliary electrode layer.

18. The manufacturing method of a light-emitting device, according to claim 16, wherein unevenness is formed in the second electrode after the second electrode is formed.

19. The manufacturing method of a light-emitting device, according to claim 16, wherein an uneven layer having a property of transmitting visible light is formed over the second electrode after the second electrode is formed.

20. The manufacturing method of a light-emitting device, according to claim 16, wherein a composite material layer containing an organic compound and a metal oxide, which is in contact with the first electrode, is formed as one layer in the layer containing the light-emitting organic compound.

21. The manufacturing method of a light-emitting device, according to claim 16, wherein a composite material layer containing an organic compound and a metal oxide, which is in contact with the second electrode, is formed as one layer in the layer containing the light-emitting organic compound.

* * * * *